US008633545B2

(12) United States Patent
Lee

(10) Patent No.: US 8,633,545 B2
(45) Date of Patent: Jan. 21, 2014

(54) SADDLE TYPE MOS DEVICE

(75) Inventor: Jong-Ho Lee, Daegu (KR)

(73) Assignee: SNU R&DB Foundation (KR)

( * ) Notice: Subject to any disclaimer, the term of this patent is extended or adjusted under 35 U.S.C. 154(b) by 556 days.

(21) Appl. No.: 11/719,923

(22) PCT Filed: Dec. 6, 2005

(86) PCT No.: PCT/KR2005/004148
§ 371 (c)(1),
(2), (4) Date: Jul. 5, 2007

(87) PCT Pub. No.: WO2006/062331
PCT Pub. Date: Jun. 15, 2006

(65) Prior Publication Data
US 2009/0108358 A1  Apr. 30, 2009

(30) Foreign Application Priority Data
Dec. 11, 2004 (KR) .................. 10-2004-0104560

(51) Int. Cl.
*H01L 21/70* (2006.01)
(52) U.S. Cl.
USPC .................................. 257/368; 257/E27.06
(58) Field of Classification Search
USPC ............. 257/374, 396, 397, 401, E29.021, 257/E29.028, E29.051, E29.052, E29.12, 257/E29.121, E29.201, E29.26, 368, 410, 257/E27.06
See application file for complete search history.

(56) References Cited

U.S. PATENT DOCUMENTS 5,583,065 A  12/1996 Miwa
5,773,343 A   6/1998 Lee
(Continued)

FOREIGN PATENT DOCUMENTS

JP  2003-298051  10/2003
KR  1996-43238  12/1996
(Continued)

OTHER PUBLICATIONS

J.Y. Kim et al., "The breakthrough . . . " in Proc. Symp on VLSI Tech., P11, 2003 KR 0287068 accompanied by an English translation.

(Continued)

*Primary Examiner* — Vongsavanh Sengdara
(74) *Attorney, Agent, or Firm* — Cantor Colburn LLP

(57) ABSTRACT

The present invention relates to a nano-scale MOS device having a saddle structure. Particularly, the invention relates to a high-density, high-performance MOS device having a novel structure capable of improving the scaling-down characteristic and performance of the MOS device, in which a channel and gate structure is formed in the shape of a saddle. The inventive MOS device is mainly characterized in that a channel region is recessed, a gate insulating film and a gate electrode are formed on the surface and sides of the recessed channel, and the gate electrode is self-aligned with the recessed channel. Namely, in the disclosed MOS device, a portion of the insulating film around the recessed channel is selectively removed to expose the surface and sides of the recessed channel. According to the present invention, the scaling-down characteristic of the device is excellent and current drive capability is greatly increased since a channel through which an electric current can flow is formed on the surface and sides of the recessed channel. Also, the ability of the gate electrode to control the channel is enhanced. Accordingly, the invention can improve device characteristics.

9 Claims, 10 Drawing Sheets

(56) References Cited

U.S. PATENT DOCUMENTS

| | | | |
|---|---|---|---|
| 5,844,278 A | 12/1998 | Mizuno et al. | |
| 6,413,802 B1 | 7/2002 | Hu et al. | |
| 6,562,665 B1* | 5/2003 | Yu | 438/149 |
| 6,878,597 B2* | 4/2005 | Kim | 438/303 |
| 6,885,055 B2 | 4/2005 | Lee | |
| 7,005,700 B2 | 2/2006 | Lee | |
| 7,193,893 B2* | 3/2007 | Forbes | 365/185.05 |
| 2001/0034109 A1* | 10/2001 | Madson et al. | 438/412 |
| 2004/0063286 A1* | 4/2004 | Kim et al. | 438/283 |
| 2004/0173812 A1* | 9/2004 | Currie et al. | 257/103 |
| 2005/0042833 A1* | 2/2005 | Park et al. | 438/282 |
| 2005/0056888 A1* | 3/2005 | Youn et al. | 257/331 |
| 2005/0062109 A1* | 3/2005 | Kim et al. | 257/397 |
| 2005/0145932 A1* | 7/2005 | Park et al. | 257/328 |
| 2005/0253166 A1* | 11/2005 | Ke et al. | 257/192 |
| 2006/0056228 A1* | 3/2006 | Schloesser et al. | 365/149 |

FOREIGN PATENT DOCUMENTS

| | | |
|---|---|---|
| KR | 10-20030420070 | 2/2003 |
| KR | 2002-5325 | 8/2003 |
| KR | 0287068 | 12/2003 |
| KR | 10-200474501 | 8/2004 |
| KR | 2005-64233 | 6/2005 |
| WO | 2006062332 | 6/2006 |

OTHER PUBLICATIONS

English Language Abstract of KR 2002-5325.

English Language Abstract of JP 2003-298051.

J.Y. Kim et al., "The Breakthrough in data retention time of DRAM using Recess-Channel-Array Transistor (RCAT) for 88nm feature size and beyond", Symposium on VLSI Tchnology Digest of Technical Papers, 2003.

Kenji Natori et al., "An Analysis of the Concave MOSFET", IEEE Transactions on Electron Devices, vol. ED-25, No. 4, Apr. 1978, pp. 448-456.

* cited by examiner

Fig. 6
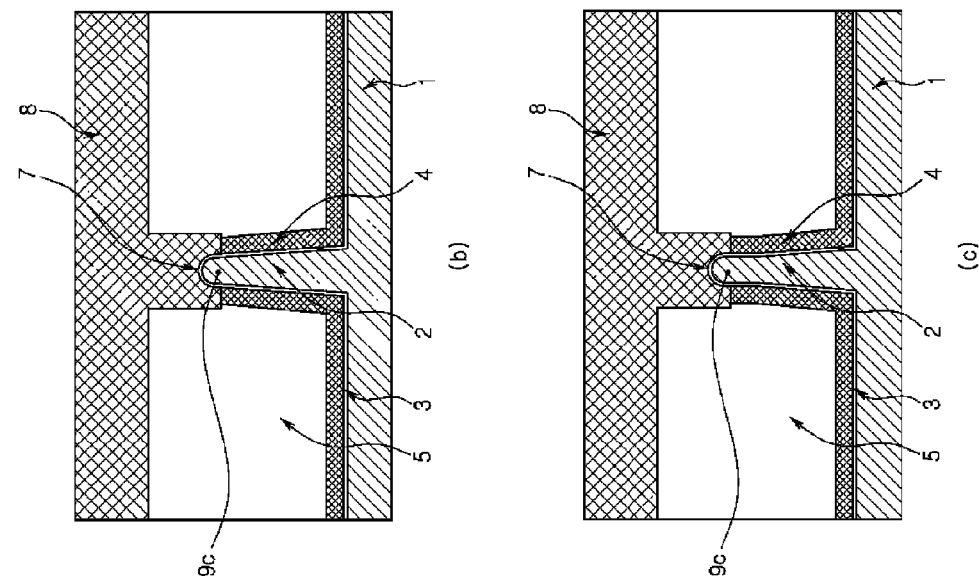
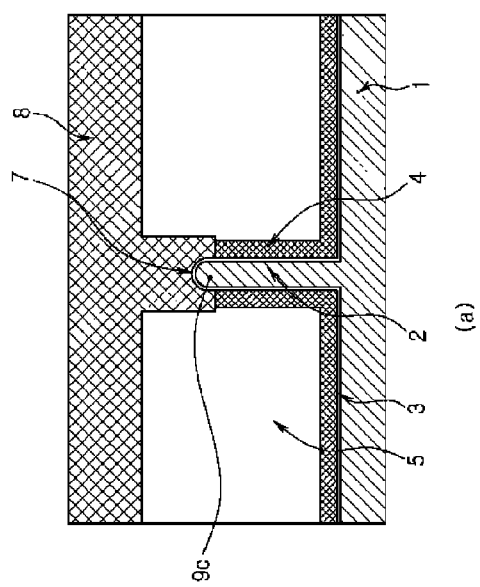

SADDLE TYPE MOS DEVICE

TECHNICAL FIELD

The present invention relates to a nano-scale MOS device having a saddle structure. More particularly, it relates to a highly integrated, high-performance MOS device having a novel structure capable of improving the scaling-down characteristic and performance of the MOS device, in which a channel and gate structure is formed in the shape of a saddle.

BACKGROUND ART

Recently, the gate size of devices in CMOS technology has been reduced to less than 100 nm, and devices for high-speed logic and memory applications have been actively developed. In MOS devices for logic applications, the thickness of a gate insulating film can be reduced to 2 nm or less, and thus so-called short-channel effect can be suppressed. The MOS devices can be applied in various fields such as CPU and logic, although they have some short-channel effects.

However, in DRAM applications, the thickness of the gate insulating film must be at least 5 nm. Although this thickness can decrease according to the development of technology in future, it will be difficult to decrease greatly. Thus, since the gate insulating film in MOS devices for DRAM application can be reduced only to a limited extent as compared to that in devices for logic applications, the existing MOS devices having a planar channel have a severe short-channel effect.

One of methods capable of solving this problem is to recess a channel region. In the structure having the recessed channel region, the short-channel effect can be improved as compared to the existing planar channel MOS devices. Also, the sensitivity of threshold voltage to the doping concentration or profile of corner regions formed at the bottom of the recessed channel are very high, even when the corner regions are made round. Furthermore, in these recessed devices, a change in threshold voltage due to substrate bias is much greater than in the existing planar channel structure, and the effective channel length is increased due to the channel recess. Thus, the recessed structures have a shortcoming in that, if the channel width becomes narrower, the current drivability will be greatly reduced. The general feature of the recessed channel devices is that the gate electrode is inferior in its ability to control the channel to that in the planar channel devices. This is associated with a large substrate bias effect.

The case where a gate electrode is excellent in its ability to control a channel is a double/triple-gate MOS structure, in which the gate wraps the channel region. The present inventors developed, for the first time in the world, a body-tied double/triple-gate MOS structure (Korean Patent Application No. 2002-5325, Japanese Patent Application No. 2003-298051, and U.S. patent application Ser. No. 10/358,981) and the application thereof to flash memories (Korean Patent Registration No. 0420070 and U.S. patent application Ser. No. 10/751,860, and named this structure "bulk FinFET".

In this structure, the channel is not recessed, and is formed either on the surface and both sides of the active body or on both sides of the body, so that the structure is much superior in the ability of the gate to control the channel to the existing planar channel devices, and has a very small substrate bias effect. However, in order to suppress the short-channel effect, the body width must be about ⅔ of physical gate length. This means formation of a silicon body having a width narrower than the minimum gate length, causing a process problem.

Meanwhile, the existing planar channel MOS devices with a gate length of less than 100 nm show various problems in scaling down. It is reported that the existing planar channel device can be currently scaled down to a gate length of less than 50 nm, and the scaling down of the existing planar channel device structure encounters the problem of so-called short-channel effect. Generally, with the scaling-down of devices, the thickness of the gate insulating film can also be reduced, and thus the short-channel effect can be suppressed partly. In MOS devices for logic applications, the thickness of the gate oxide film can be reduced to less than 2 nm, so that the short-channel effect resulting from a reduction in the gate length can be somewhat suppressed. MOS devices having a little short-channel effect can be used for logic circuit applications.

With the scaling down of MOS devices for logic applications, the channel length of devices for dynamic random access memory (DRAM) applications decreases to less than 70 nm, while these devices encounter larger difficulty in scaling down than those for logic applications. In MOS devices for DRAM applications, since the thickness of the gate insulating film is generally about 5 nm or thinner, the above-mentioned short-channel effect is not effectively suppressed. If the operating voltage of DRAM and the thickness of the gate insulating film are reduced at a given gate length, the scaling-down at a gate length of less than 70 nm seems likely to be possible. However, according to general scaling rule, the scaling down of DRAM devices with conventional planar channel structure seems to be difficult, and a change in device structure to solve this difficulty is required.

A case where a device, fabricated by simply etching a channel to make a recessed channel and forming a gate insulating film and then a gate electrode is applied to DRAM, was proposed by Samsung Electronics Co. in the year 2003 (J. Y. Kim et al., "The breakthrough in data retention time of DRAM using recess-channel-array transistor (RCAT) for 88 nm feature size and beyond", in Proc. Symp. on VLSI Tech., p. 11, 2003).

SUMMARY OF THE INVENTION

In the prior art as shown in FIG. 1, the recess depth of the recessed channel can be made deep. This can increase the effective channel length, resulting in suppression of the short-channel effect. However, since the effective channel length is long, this device has a shortcoming in that, if the channel width of the device is decreased to increase integration density, the current drive ability of the device will be significantly reduced. In addition, this device has shortcomings in that two corners (or rounded bottom) clearly appear in the recessed channel region in the channel length direction, and if the channel doping concentration around these corners (or rounded bottom) is changed even a little, threshold voltage will be greatly changed. In this device, the doping concentration is increased generally near the bottom of the recessed channel region.

Since recess-channel devices generally have a concave channel structure, they have problems in that the back-bias effect seriously occurs and, for example, the threshold voltage of NMOS devices greatly increases for a negative (−) back bias.

Accordingly, the present invention has been made to solve the above-mentioned problems, and it is an object of the present invention to provide a MOS device which overcomes problems with the existing recess-channel devices, including a reduction in current drive capability resulting from a reduction in the effective width of a channel, a large change in threshold voltage resulting from a change in doping concentration in the corner regions (or bottom) of the recessed channel, a high back-bias effect and the like, while having high current drive capability and excellent subthreshold swing, even when the effective width of the channel becomes smaller.

Another object of the present invention is to provide a MOS device having side channels formed by a method in which a nitride film (or an insulator with etch selectivity) around a recessed silicon body is selectively etched so as to be aligned in a recessed channel region, such that the sides of the recessed silicon channel are clearly exposed.

As described above, the present invention can realize a MOS device in which a channel and gate structure is in the shape of a saddle.

Because the saddle-type MOS device structure according to the present invention has a recessed channel structure and a triple-gate structure, it has all the advantages of the existing double/triple-gate MOSFETs and the advantages of the recessed channel MOSFETs. In addition to these advantages, the present invention provides the following additional advantages.

The existing bulk FinFET requires a fin body width corresponding to ⅔ of the gate length, whereas the inventive structure has no problem even when making the body width equal to the gate length or thicker, and can provide the advantages intended in the present invention.

Also, side channels can be formed by selectively etching a nitride film (or an insulator with etch selectivity) around a recessed channel region to precisely expose the sides of the recessed channel region.

Moreover, although the channel is recessed, the gate electrode in the inventive structure is excellent in its ability to control the channel since the gate is formed on the surface and the sides of the recessed region. Also, the inventive structure can reduce a change in threshold voltage resulting from back bias, and reduce a change in threshold voltage resulting from a change in impurity concentration in the corner regions (or bottom) of the recessed channel region. In addition, since the channel is formed on the surface and sides of the recessed channel region, the inventive structure can have high current drive capability.

BRIEF DESCRIPTION OF THE DRAWINGS

In FIG. 1, (a): a top view; (b): a three-dimensional perspective view; (c): an A-A cross-sectional view; and (d): a B-B cross-sectional view.

In FIG. 2, (a): a top view; (b): a three-dimensional perspective view; (c) an A-A cross-sectional view; (d): a B-B cross-sectional view; and (e): a C-C cross-sectional view.

In FIG. 3, (a): a top view; (b): a three-dimensional perspective view; (c) an A-A cross-sectional view; and (d): a B-B cross-sectional view.

In FIG. 5, (a): a top view; (b) an A-A cross-sectional view; and (c): a C-C cross-sectional view.

FIGS. 6a to 6c show that the corners between the surface sides of a recessed channel region in the structure shown in part (d) of FIG. 2 are made round.

DETAILED DESCRIPTION OF THE INVENTION

Figure 1:
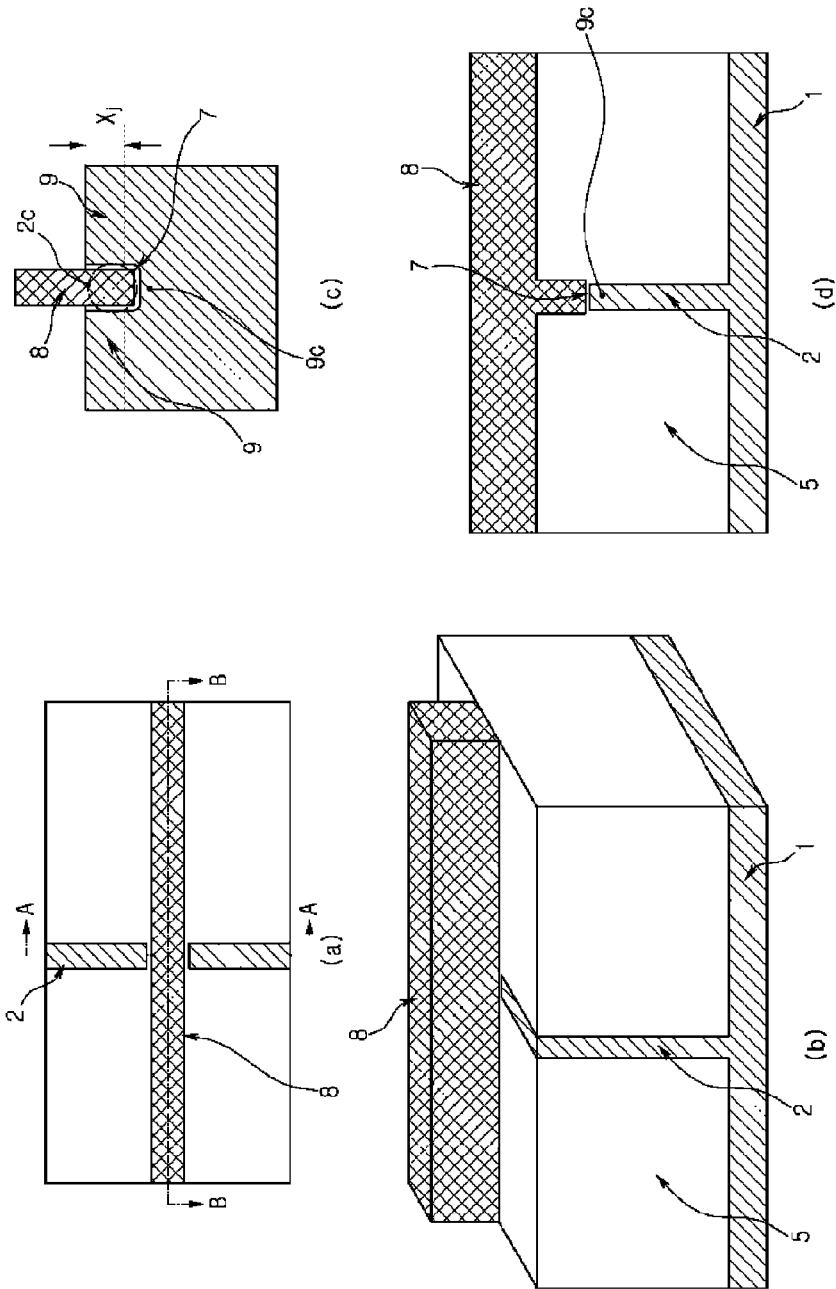
FIG. 1 shows the structure of a recess-channel MOS device according to the prior art.

The present invention provides a nano-scale MOS device having a recessed channel and a saddle-type gate structure. In other words, the recessed channel region and the gate electrode are formed in the form of a saddle. The inventive MOS device is mainly characterized in that a channel region is recessed, a gate insulating film and a gate electrode are formed on the surface of the recess region of the recessed channel and sides of the recessed channel near the recess region thereof, and the gate electrode is self-aligned with the recessed channel.

More specifically, the present invention provides a MOS device comprising: a silicon substrate 1 having formed thereon a wall-type silicon body 2 connected with the substrate; a first insulating film 3 formed on the surface of the silicon substrate 1 and the surface of the silicon body 2; a nitride film 4 formed on the first insulating film 3; a second insulating film 5 for element isolation formed on the nitride film 4; a region to be used as a channel, which is recessed from the surface of the silicon body 2 to a given depth; the nitride film 4 and the first insulating film 3 being aligned to the recessed silicon body and etched more than the recess width or depth of the silicon body 2; a gate insulating film 7 formed on the surface and sides of the recessed silicon body 2; a gate electrode 8 and a spacer 10 sequentially formed on the resulting structure; and source/drain regions 11 formed to a depth in the silicon body 2 on both sides of the gate electrode 8. The depth of the source/drain region is shallower than that of the recess region.

In another embodiment, the present invention provides a MOS device comprising: a silicon substrate 1 having formed thereon a wall-type silicon body 2 connected with the substrate; a first insulating film 3 formed on the surface of the silicon substrate 1 and the surface of the silicon body 2; a nitride film 4 formed on the first insulating film 3; a second insulating film 5 for element isolation formed on the nitride film 4; a region to be used as a channel, which is recessed from the surface of the silicon body 2 to a predetermined depth; the second insulating film 5 being, if necessary, recessed from the surface thereof to a predetermined depth; the nitride film 4 and the first insulating film 3 being aligned to the recessed silicon body 2 and etched more than the recess width or depth of the silicon body 2; a gate insulating film 7 formed on the surface and sides of the recessed silicon body 2; a gate electrode 8 and a spacer 10 sequentially formed on the resulting structure; and source/drain regions 11 formed to a depth in the silicon body 2 on both sides of the gate electrode 8.

Hereinafter, the construction and operation of embodiments of the present invention will be described in detail with reference to the accompanying drawings.

Figure 2:
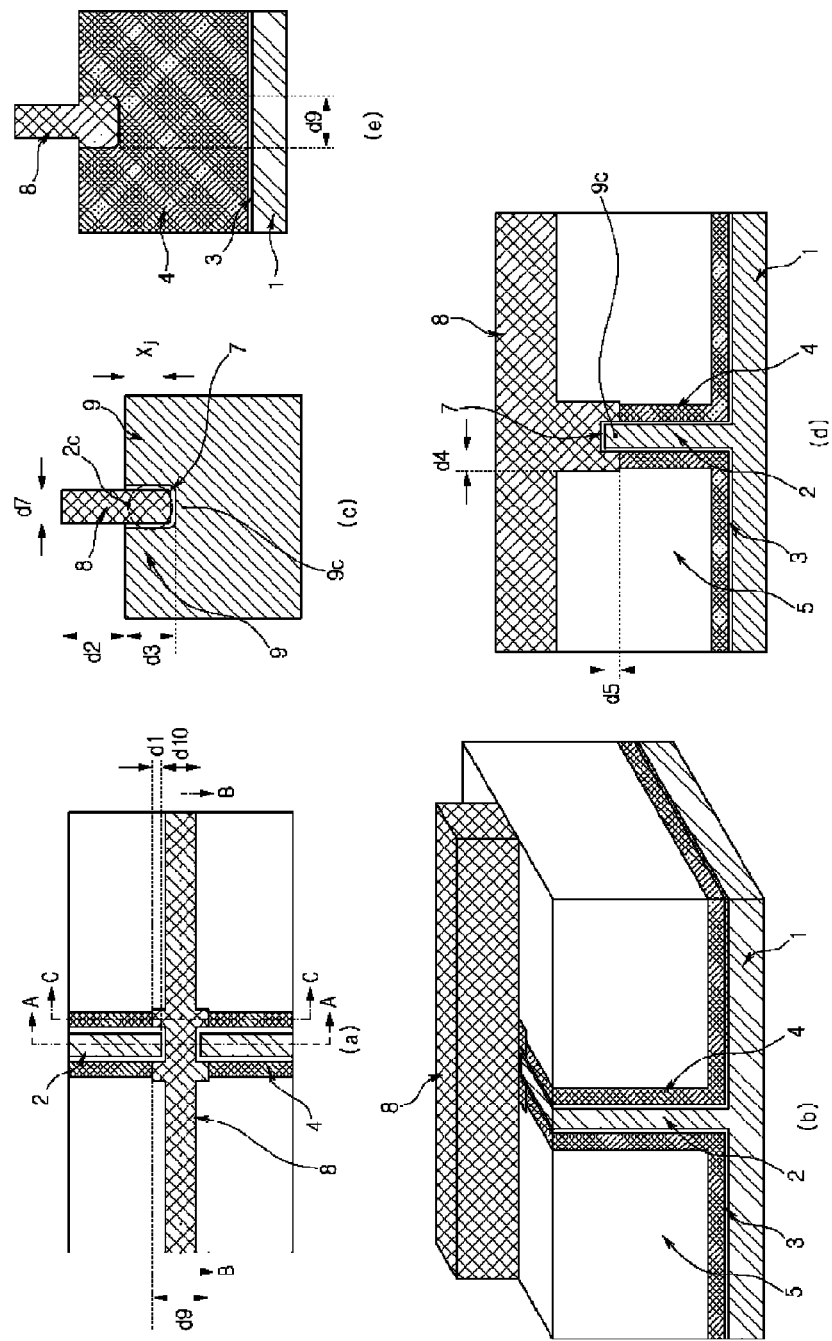
FIG. 2 shows the structure of a saddle-type MOS according to the present invention.

FIG. 2 shows a saddle-type MOS device according to the present invention. Here, the "saddle-type MOS device" means a MOS device, of which channel region is recessed to form a recess region, and of which gate electrode is formed in the form of a saddle. That is, the gate electrode extends to the recess region of the recessed channel region and further to sides of the recessed channel region beyond the recess region thereof to thereby result in a saddle-like form, as shown in the accompanying drawings and described hereafter in detail. FIG. 2c is an A-A cross-sectional view taken along the active region in FIG. 2a. FIG. 2d is a B-B cross-sectional view taken along the gate electrode formed in the recessed channel region in FIG. 2a. Also, the three-dimensional device structure of FIG. 2b shows important parts except for metal interconnections or source/drain contact regions. FIG. 2 shows a structure obtained just after forming a gate electrode and source/drain regions, and subsequent steps are the same as CMOS processing technology. In FIG. 2b, region 1 is a silicon substrate, and region 2 is a wall-type silicon body 2 in which an active region is formed. The wall type silicon body 2 protrudes substantially perpendicular to the silicon substrate 2. The wall type silicon body 2 has a top surface, side surfaces, a length, a height from the silicon substrate, and a thickness.

Referring to FIG. 2, the active region formed the wall type silicon body includes a channel region 9c, a source region formed at one side of the channel region 9c, and a drain region at the other side of the channel region 9c. In other words, the source, channel and drain regions are formed in longitudinal direction of the wall type silicon body 2 in the described order or vice versa. The source/drain regions are denoted by reference number 9. As clearly shown in FIGS. 2(c) and 2(d), a portion of the top surface corresponding to the channel region 9c is depressed toward the silicon substrate 1 to form a recess region 2c defined by a recessed top surface. Thus, the channel region 9c has a height less than other regions, e.g., the source/drain regions 9. As shown in FIG. 2(c), the top surface in the channel region is depressed by d3 toward the substrate 1. This configuration of the channel region having the recess region 2c is denoted hereafter by a "recessed channel region 9c."

The thickness of the wall-type silicon body 2 is suitably selected in a range of 3-100 nm. Region 3 is a first oxide film (or insulating film) having a thickness of 1-20 nm. Region 4 is a nitride film, the thickness of which can be adjusted depending on a given technology level and may vary in a range of 1-200 nm. The presence of this nitride film is useful in clearly exposing the sides of the recessed silicon body in a subsequent process step. Namely, when the silicon body 2 is recessed and then the nitride film of region 4 is selectively etched in a suitable process sequence, the sides of the recessed silicon body, covered with the thin insulating film 3, will be exposed and when the thin insulating film 3 is removed, the sides of the recessed silicon body can be clearly exposed. If the nitride film of region 4 is not present or used, the insulating film around the recessed silicon body 2 must be etched in order to expose the sides of the recessed silicon body 2. In this case, there is a problem in that the width of the side channels to be exposed cannot be precisely controlled, since the boundary between the exposed silicon and the remaining insulating film may not be clear depending on the etching properties of the insulating film.

Region 5 corresponds to a field insulating film or isolating insulating film for isolation between elements, and the thickness thereof is selected in a range of 50-1000 nm. Region 7 is a gate insulating film which is formed on the top surface and exposed sides of the recessed channel region 2c to a thickness ranging from 0.5 nm to 15 nm.

Region 8 represents a gate electrode, which has a thickness of 2-500 nm and may be made of amorphous silicon or polysilicon, amorphous SiGe or poly-SiGe, metals having various work functions, silicide, or a combination thereof. Region 7 represents a gate insulating film, which is disposed between the gate electrode 8 and the active region 2 including the recessing channel region 9c. As shown in FIGS. 2(c) and 2(d), the gate electrode 8 extends into the recess region 2c of the recessed channel region 9c (as denoted by d3 in FIG. 2(c)) and further extends to the both sides of the recess channel region 9c beyond the bottom of the recess region 2c thereof (denoted by d5 in FIG. 2(d)). In other words, the gate electrode 8 is formed in the form of a saddle at near the recess region 2c of the recessed channel region 9c, with the gate insulating film 7 disposed between the gate electrode 8 and the recessed channel region 9c. In the structure shown in FIG. 2, the width d9 of the gate electrode 9 formed in the recessed channel region 9c may be the same or somewhat different from the width d7 of the gate electrode formed in other regions. Part (a) of FIG. 2 shows the upper side (top view) of part (b), a three-dimensional view. Part (e) of FIG. 2 is a cross-sectional view taken along the line C-C in FIG. 2(a). In part (a) of FIG. 2, distance d1 is a distance obtained by etching the nitride film of region 4 with respect to the edge of the recess region 2c so as to make the etched portion larger than the width of the recess region of the active silicon body 2, thus resulting the gate electrode 8 to surround the sides of the recessed channel region 9c to form a more saddle-like shape, as shown in FIG. 2(c), (c) and (d). Distance d1 is in a range in 1-200 nm. In (c) of FIG. 2, d2 represents the height of the gate electrode protruded upward from the surface of the active silicon body. The protruded height is in a range of 1-300 nm.

In part (c) of FIG. 2, d3 represents the depth recessed from the top surface of the active region and is in a range of 10-300 nm. In part (d) of FIG. 2, the corners of the recessed channel region can be made angular or round, according to application. In part (d) of FIG. 2, d4 is associated with the thickness of the nitride film 4 and represents the width of the gate electrode surrounding the sides of the recessed channel region 9c. d4 is in a range of 3-200 nm. In (d) of FIG. 2, d5 has the same size as d1 shown in FIG. 2a, and represents the distance by which the sides of the recessed channel region are exposed. In some cases, the exposed distance of the side channel in the depth direction in the recessed channel region may be made larger than the distance d1 on the surface.

Figure 5:
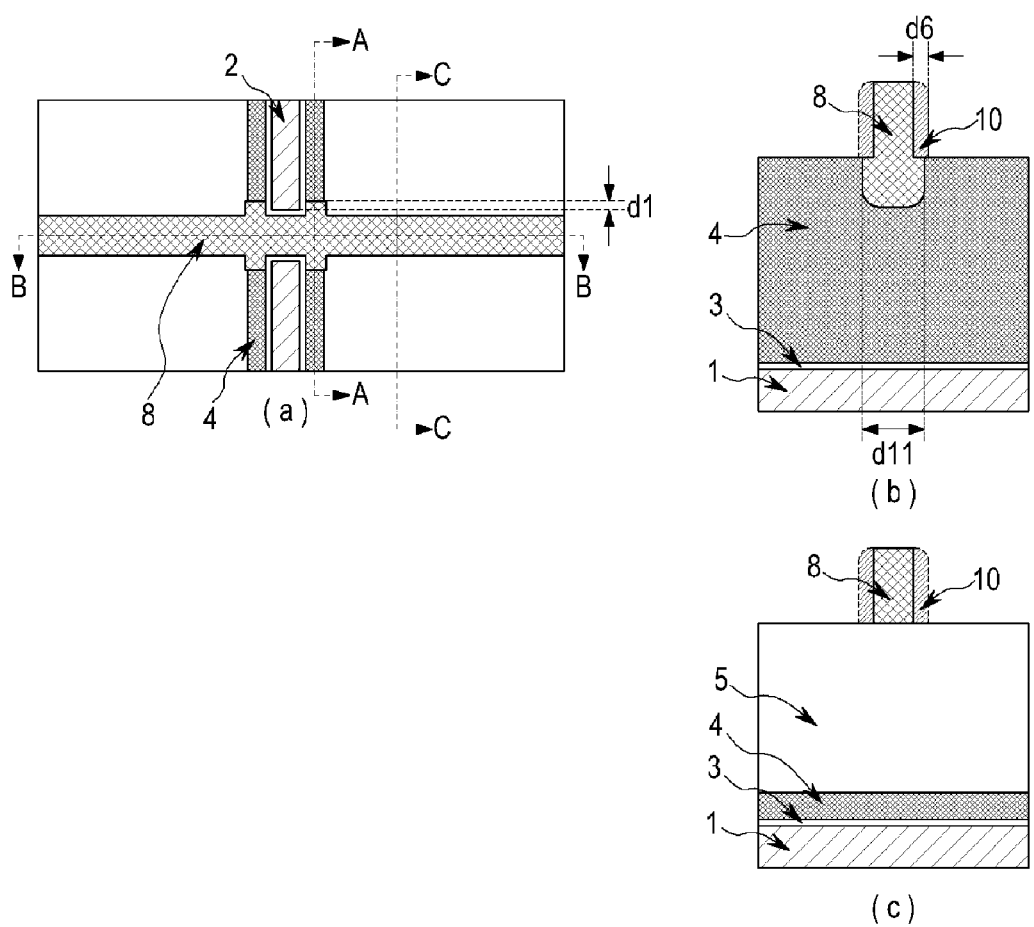
FIG. 5 shows a cross-sectional structure view taken along the center of the nitride film shown in part (a) of FIG. 2.

After forming the structure as shown in part (b) of FIG. 5, a spacer 10 may be formed around the gate electrode 8. The width of the spacer 10 can be made larger than the sum of distance d1 shown in FIG. 2a and the thickness of the gate insulating film 7. By doing so, in a subsequent process of filling a metal wiring material in a contact hole formed after forming an insulating film, the metal wiring material can be prevented from forming short circuits with the gate electrode surrounding the side channels. Thus, it can effectively increase integration density.

Figure 3:
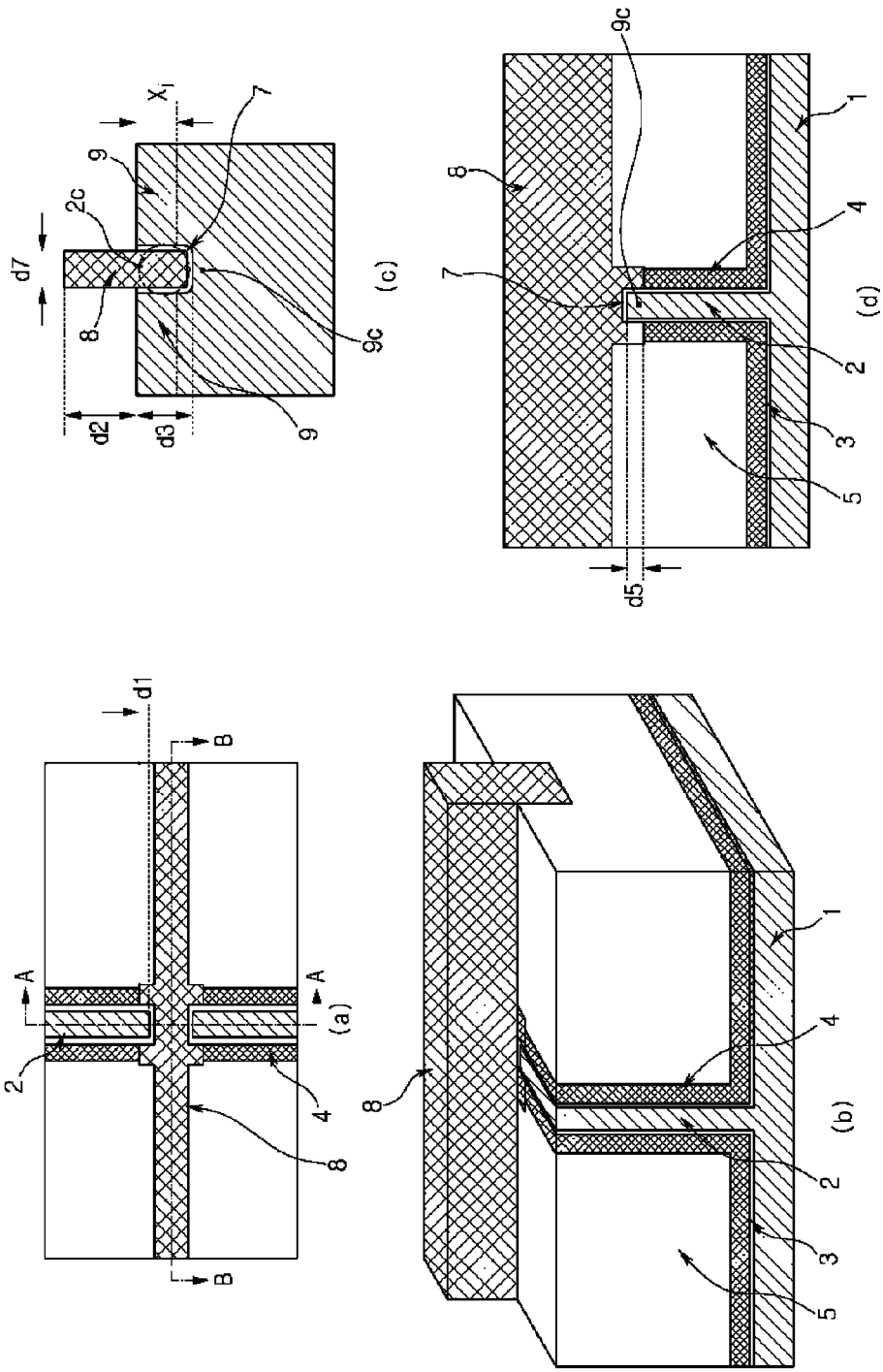
FIG. 3 shows the structure of a MOS device according to a modified embodiment of the present invention.

FIG. 3 shows a slight modification of the structure shown in FIG. 2. The difference from FIG. 2 is the cross-sectional shapes of regions 5 and 8 shown in the right side of part (b) of FIG. 3. In FIG. 3, a gate electrode 8 in the field insulating film of region 5 is formed together with the gate electrode around the recessed silicon body as self-aligned manner. The self-aligned gate electrode is made by recessing the wall-type silicon body 2 to be formed with a channel, removing the insulating film of region 3 and the nitride film of region 4 on both sides of the recessed silicon body to expose side channels, and recessing the field insulating film of region 5. That is, as shown in FIG. 2(b) and FIG. 3(b), a channel is formed in the field insulating film 5 along the gate electrode 8, and the gate electrode 8 is extended into the channel.

Figure 4:
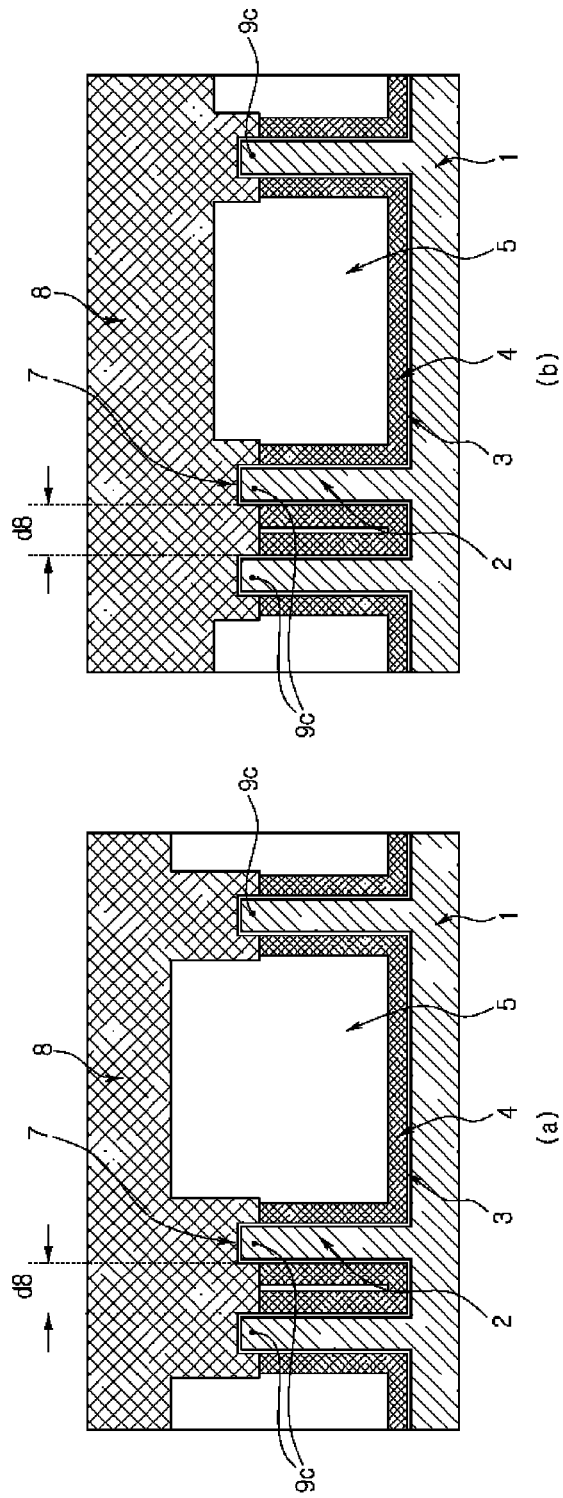
FIGS. 4a and 4b show the cross-sectional structure of the gate electrode shown in FIG. 2.

Part (a) of FIG. 4 illustrates that pluralities of wall-type bodies 2 are formed in the structure of FIG. 2, and shows a cross-sectional structure between the wall-type silicon bodies 2 having a close interval and the silicon bodies having a long interval, taken along the gate electrode 8. As shown in the right side of part (b) of FIG. 4, in the case where the interval between the silicon bodies 2 is long, the thickness of the initially formed field isolating oxide film 5 is maintained almost intact. The minimum interval between the wall-type bodies 2 can be equal to the minimum body width (3 nm). The interval can be changed by trimming a process for body formation or changing the distance in physical layout. Referring to the left side of part (a) of FIG. 4, the interval between the silicon bodies 2 can be seen to be close. In this case, since the total width (d8 in FIG. 4) of insulating films between the silicon bodies is small, the isolating insulating film 5 is removed during etching after recess so that the isolating insulating film 5 is formed lower than the surface of the recessed silicon body. A structure shown in part (b) of FIG. 4 corresponds to the structure of FIG. 3 has thinner field insulating film of region 5 than that shown in part (a) of FIG. 4 because region 5 is recessed to a suitable depth. In this respect, the isolating insulating film 5 between the silicon bodies close to each other is thinner in the horizontal direction than in the vertical direction, and is easily etched according to the above-described principle so that the surface thereof is formed lower than the surface of the recessed silicon bodies.

Part (b) of FIG. 5 is a cross-sectional view taken along the center of the nitride film of region 4 formed on the side of the wall-type silicon body 2 in part (a) of FIG. 2, and part (c) of FIG. 5 is a cross-sectional view taken across the gate electrode on the isolating insulating film. In part (b) of FIG. 5, since the recess width (d9 in FIG. 2) of the nitride film of region 4 is made larger than the recess width (d10 in FIG. 2) of the silicon body by selective etching, the width (d11 in FIG. 5) of the gate electrode 8 in the recessed nitride film region is made larger than the protrusion width (d7 in FIG. 2). If process conditions are changed, the width of the gate electrode formed on the surface of the silicon body can be made larger.

In part (c) of FIG. 5, since the isolating insulating film of region 5 is not intentionally etched in a recess form, the gate electrode 8 is formed only on the surface of region 5. In parts (b) and (c) of FIG. 5, a spacer of region 10 is shown in the form of a dashed-line, and is formed after forming the gate electrode. The suitable width of the spacer 10 is preferably larger than the sum of d1 shown in FIG. 5a and the thickness of the gate insulating film. In part (b) of FIG. 5, if the gate electrode 8 buried in the nitride film 4 causes stress with the nitride film 4, an insulating film can be formed between the nitride film 4 and the gate electrode 8.

FIG. 6 shows the cross-sectional structure of a wall-type silicon body 2, taken along the gate electrode at a point where the gate electrode 8 and the silicon body 2 in the structure of FIG. 2 meet each other. The corners formed along the top surface of the recessed channel region 9c of the wall type silicon body 2 are made round so as to be able to prevent the concentration of electric field from the gate electrode 8, thus improving the reliability of the device. Also, parasitic channels being able to be formed along the corners can be removed to reduce leakage current.

In part (b) of FIG. 6, the corners of the recessed channel region are made round, and the width of the wall type silicon body becomes gradually larger toward the substrate of region 1 so as to be able to reduce the resistance of the body. In part (c) of FIG. 6, the corners of the recessed channel region 9c of the wall type silicon body are made round, and the body of region 2 is maintained almost vertical around channels, including side channels, and is gradually larger below thereof.

Figure 7:
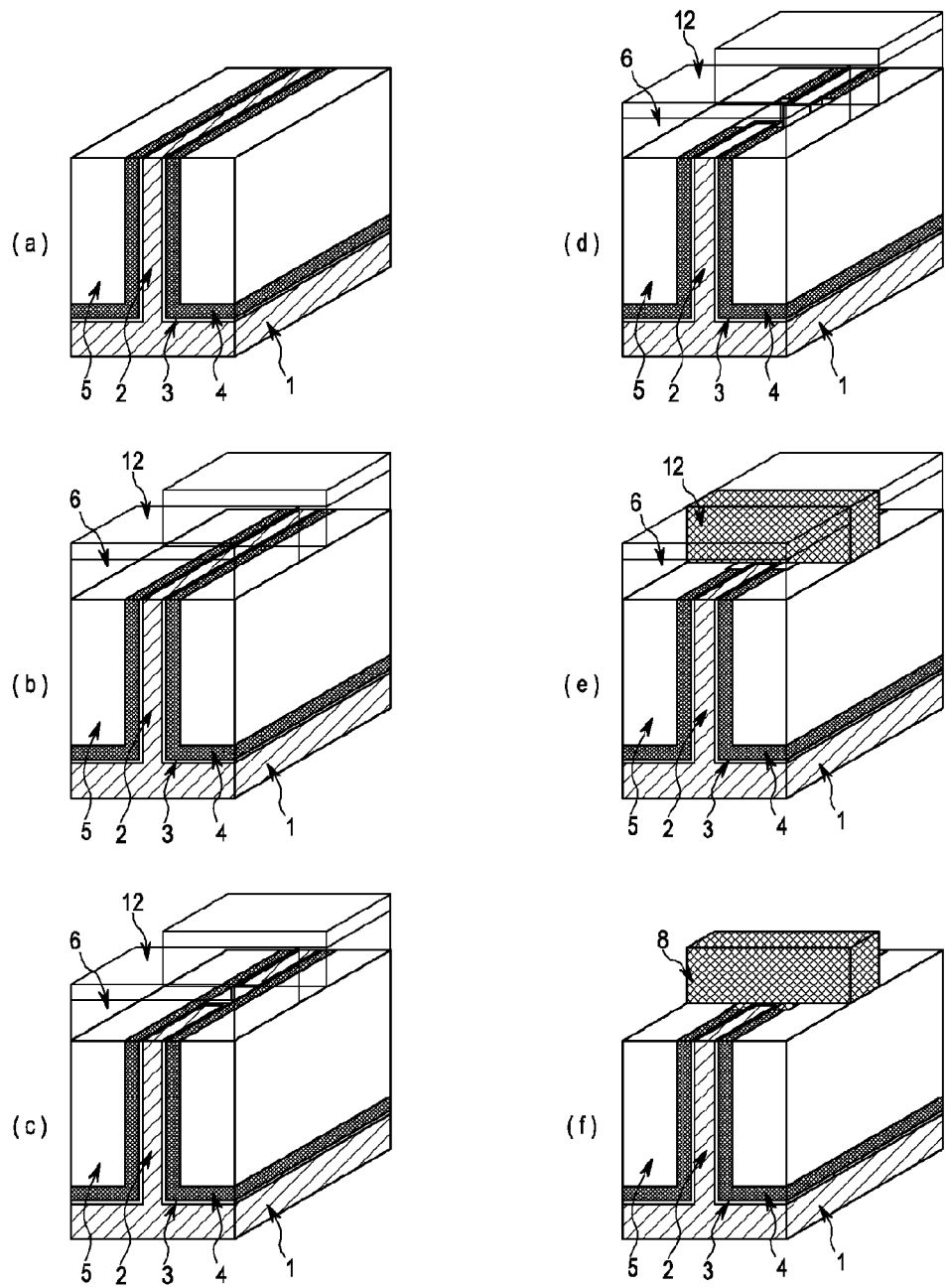
FIGS. 7a to 7f show a first embodiment of a process for making the MOS structure of FIG. 2.

FIG. 7 shows one embodiment of a method for making the MOS device structure shown in FIG. 2. FIG. 7 shows key process steps to be processed after a body in which a channel is formed, and device isolation in the form of STI (Shallow Trench Isolation), are made, and the surface is planarized. In this case, the method can be carried out in a state where some oxides have been formed on the surface of the silicon body.

Part (a) of FIG. 7 shows a planarized state after an isolation step. Part (b) of FIG. 7 shows a structure obtained after forming the amorphous silicon of region 6 and an insulating film of region 12 as a hard mask for gate open, and removing regions 12 and 6 using the gate open mask. If necessary, the process may be carried out with the patterned photoresist that remains on the insulating film of region 12.

Part (c) of FIG. 7 shows that a portion of the silicon body of region 2 for a channel region to be recessed has been partially etched using a gate open mask. For surface protection in a subsequent process, an insulating film having a thickness of 1-20 nm is selectively formed on the surface of the recessed silicon body. As shown in part (d) of FIG. 7, the nitride film of region 4 and the insulating film 3 are removed to expose the surface and sides of the recessed silicon channel. After recessing the channel, the formed selective insulating film is removed, and a process of improving the quality of the exposed silicon surface (suitable cleaning process or hydrogen annealing) is performed, and then the gate insulating film of region 7 is formed.

In carrying out the processes shown in parts (c) and (d) of FIG. 7, regions 2 and 6 may also be etched in reverse order. Although not shown in the drawings, the field insulating film may also be recessed to make the structure of FIG. 3. Part (e) of FIG. 7 shows a structure obtained after forming and planarizing a gate electrode material. Part (f) of FIG. 7 shows that regions 6 and 12 have been selectively removed. Subsequent processes includes spacer formation, suicide formation (if necessary), insulating film formation, contact formation, metal interconnection, and the like, and are performed in a manner similar to the existing processes. In the embodiment shown in FIG. 7, channel doping can be performed following the process shown in part (a), (c) or (d) of FIG. 7. If the channel doping is performed following the process shown in part (c) or (d) of FIG. 7, it can be selectively performed only in the recessed region. Source/drain doping is preferably carried out following the process shown in part (f) of FIG. 7. In some cases, ion implantation for source/drain doping is carried out throughout the silicon body of region 2 as shown in part (a) of FIG. 7, and a region which will serve as a channel is selectively etched, whereby source/drain regions, isolated from each other, can be made.

Following the process shown in part (f) of FIG. 7, an insulating film spacer may be formed to a thickness of 5-200 nm. Preferably, the spacer material is formed to completely cover the gate electrode shown as d1 in FIG. 2(a). By doing so, in a process of performing metal interconnection after forming an insulating film and forming a contact hole, the gate electrode and a metal filled in the contact hole for interconnection metal are not short-circuited with each other. In the embodiment shown in FIG. 7, the materials of regions 6 and 12 is used to make a self-aligned gate stack, and other materials having selectivity may also be used.

Figure 8:
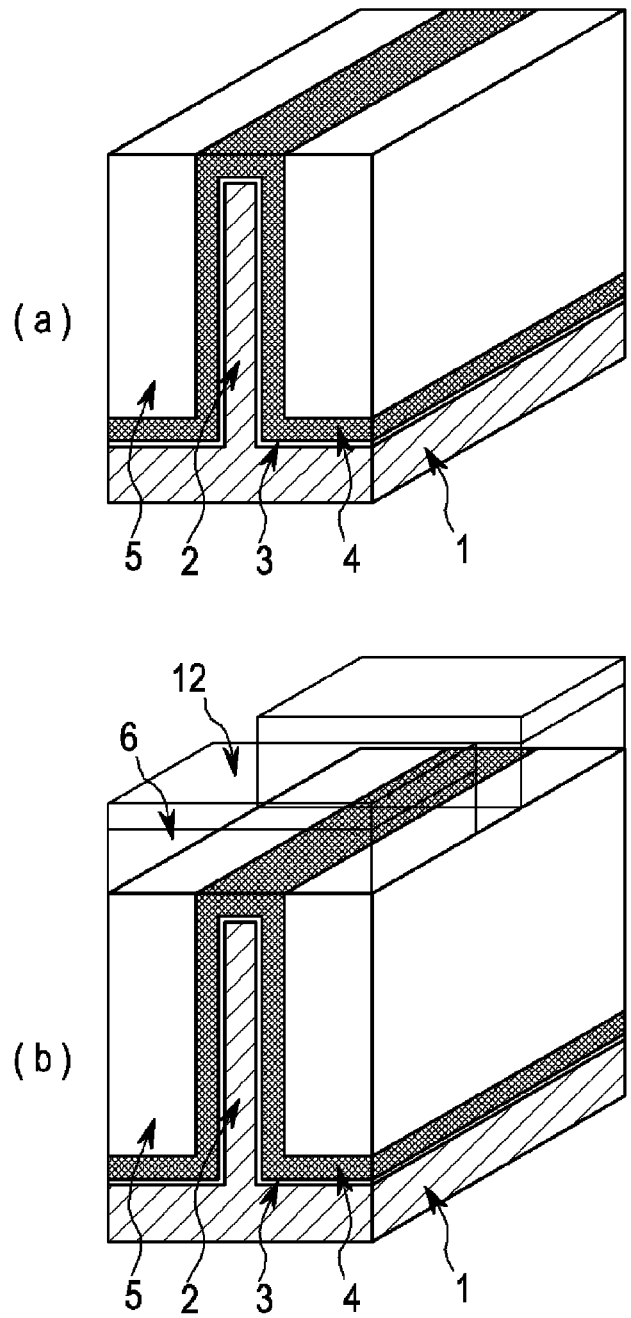
FIGS. 8a and 8b show a second embodiment of a process for making the MOS structure of FIG. 2.

FIG. 8 shows a structure capable of substituting for the structure shown in parts (a) and (b) of FIG. 7. An STI element isolation region is formed using the nitride film of region 4, and then fabrication processes similar to FIG. 7 are performed.

Figure 9:
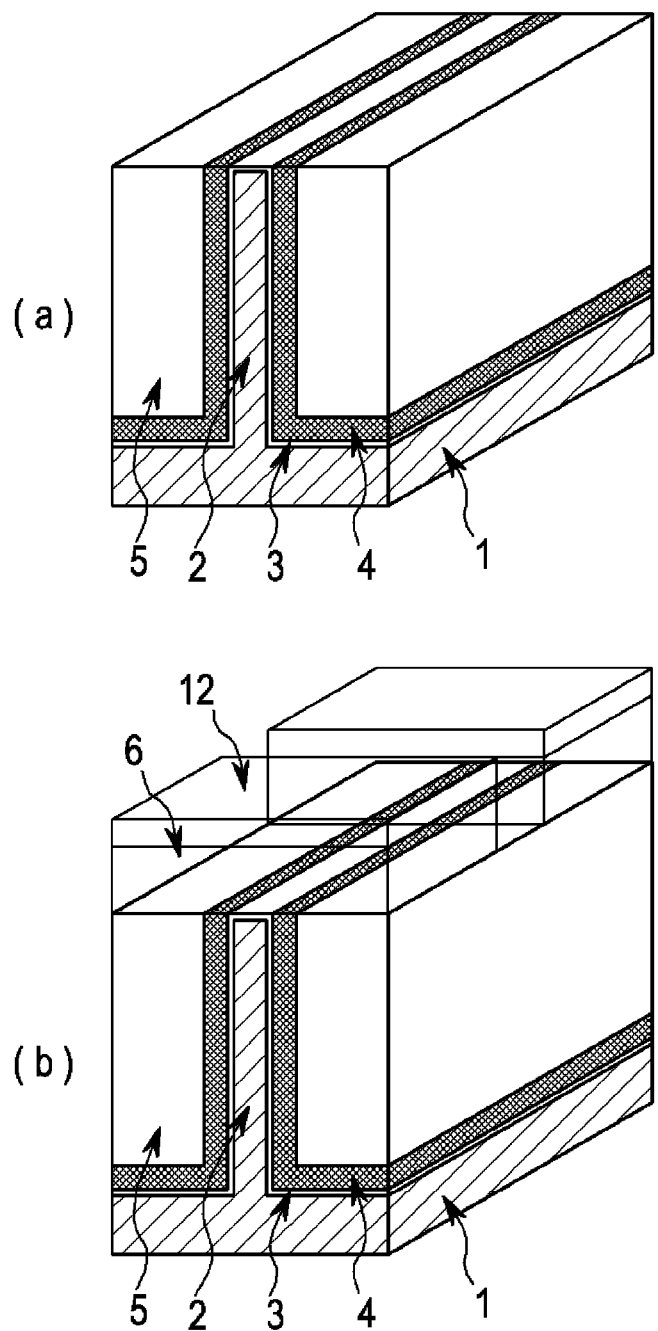
FIGS. 9a and 9b show a third embodiment of a process for making the MOS structure of FIG. 2.

FIG. 9 shows an embodiment in which a thin oxide film is formed on the surface of the silicon body in the structure shown in part (a) of FIG. 7, followed by carrying out fabrication processes similar to FIG. 7. For example, the structure shown in part (a) of FIG. 9 is obtained by selectively etching the insulating film of region 5 in part (a) of FIG. 8 up to the vicinity of the silicon surface and selectively removing the nitride film of region 4 up to the vicinity of the surface of the silicon body.

Figure 10:
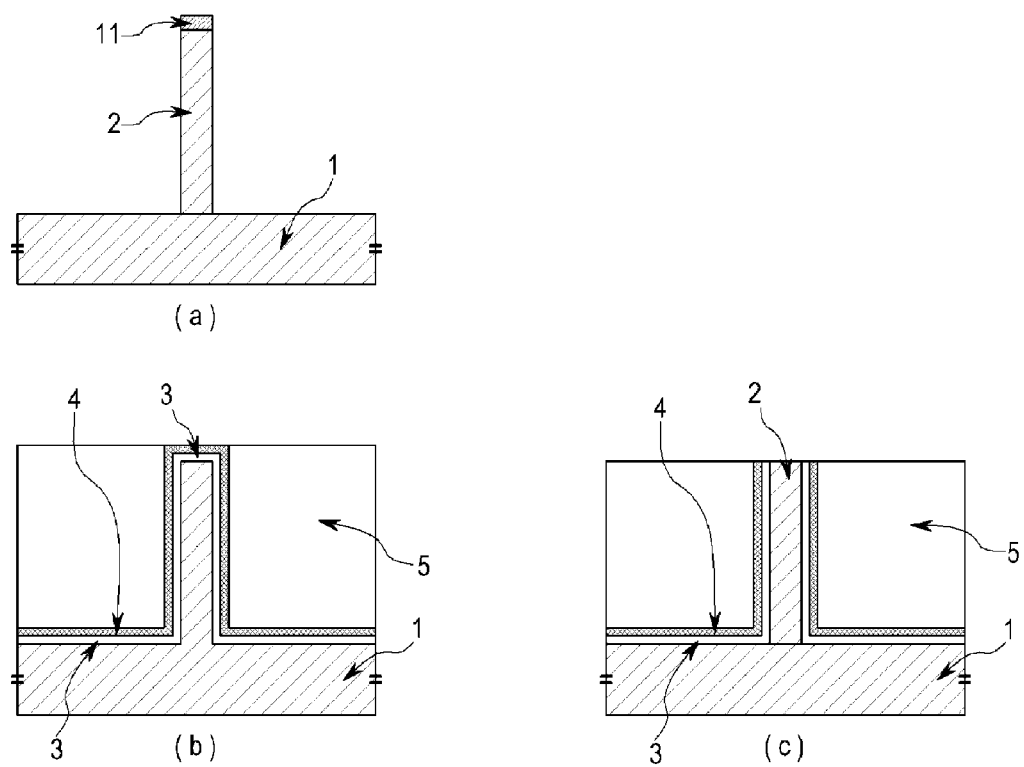
FIGS. 10a to 10c show an embodiment of a process for making regions 1, 2 and 5 for making the inventive silicon body structure.

FIG. 10 shows one method for forming the structure shown in part (a) of FIG. 7. On the silicon substrate of region 1, the insulating film of region 11 is formed, after which the insulating film is removed using a mask for defining the active body, and the silicon substrate is etched to a suitable depth of less than 500 nm as shown in part (a) of FIG. 10, thus making the wall-type silicon body of region 2. In this case, a process for reducing the width of the silicon body may be additionally performed. Also, an annealing process for improving the sides of the silicon body may be carried out. Thereafter, the insulating film is completely removed, and then the insulating film of region 3 is formed to a thickness of more than 1 nm, on which the nitride film of region 4 is formed. Then, a thick insulating film is formed and planarized, thereby forming the isolating oxide film of region 5 as shown in part (b) of FIG. 10. By a suitable planarization process, including that mentioned in the description of FIG. 10, a structure shown in part (c) of FIG. 10 can be obtained. Industrial Applicability As described above, the present invention relates to the MOS device having a saddle structure. More particularly, the present invention relates to the high-integration/high-performance MOS device having a novel structure capable of improving the scaling-down characteristic and performance of the MOS device, in which a channel and gate structure is formed in the form of a saddle. Thus, the present invention is industrially applicable.

The invention claimed is:

1. A MOS device comprising:
   a silicon substrate;
   a wall type silicon body protruding substantially perpendicular to the silicon substrate, the wall type silicon body having a height, a length, a width, a top surface and side surfaces, the wall type silicon body having a source region, a channel region and a drain region of the MOS device;
   a first insulating film formed on the top surface and the side surfaces of the wall type silicon body;
   a gate electrode formed on the channel region while having the first insulating film between the channel region and the gate electrode,
   wherein a top surface of the channel region, along with the first insulating film formed thereon, is depressed toward the silicon substrate to form a recess region to thereby define a recessed channel region near the recess region, and the gate electrode extends into the recess region and further extend, beyond the entire recess region, toward the silicon substrate along side surfaces of the recessed channel region to form side-surface portions of the gate electrode, thereby forming a saddle-like form of gate electrode at the recessed channel region;
   a silicon nitride film formed directly on the first insulation film beyond both terminal ends of the side-surface portions of the gate electrode toward the silicon substrate; and
   a second insulation film formed on the silicon nitride film.

2. The MOS device of claim 1, wherein the first insulation film is extended onto the silicon substrate and the silicon nitride film is extended onto the first insulation film formed on the silicon substrate.

3. The MOS device of claim 1, wherein the gate electrode further extends from the recess region toward the drain and source regions along the side surface of the wall type silicon body.

4. The MOS device of claim 1, wherein the silicon nitride film and the second insulating film each have a recess corresponding to the recess region, and the gate electrode extends into the recess provided in the silicon nitride film and the second insulating film.

5. The MOS device of claim 1, wherein bottom corners of the recess region have one selected from the group consisting of an obtuse angle, an acute angle, and a rounded shape.

6. The MOS device of claim 1, wherein the wall-type silicon body has a cross-section gradually wider toward the silicon substrate from a point beyond the both terminal ends of the side-surface portions of the gate electrode.

7. The MOS device of claim 1, wherein the gate electrode is formed of at least one selected from the group consisting of polysilicon, amorphous silicon, poly-SiGe, amorphous SiGe, metal, metal alloy, and silicide with metal, or the gate electrode has a stacked formation formed of at least two selected from the group consisting of the polysilicon, the amorphous silicon, the poly-SiGe, the amorphous SiGe, the metal, the metal alloy, and the silicide with metal.

8. The MOS device of claim 1, wherein a transverse width of the gate electrode above the top surface of the wall-type silicon body is larger than a width of the gate electrode below the top surface of the wall-type silicon body.

9. The MOS device of claim 1, wherein the gate electrode is self-aligned with the recessed channel region.

* * * * *